United States Patent
Jiang et al.

(10) Patent No.: US 10,256,315 B2
(45) Date of Patent: Apr. 9, 2019

(54) THIN FILM TRANSISTOR AND METHOD FOR FABRICATING THE SAME, ARRAY SUBSTRATE AND DISPLAY DEVICE

(71) Applicant: Boe Technology Group Co., Ltd., Beijing (CN)

(72) Inventors: Chunsheng Jiang, Beijing (CN); Xuyuan Li, Beijing (CN); Wei Liu, Beijing (CN); Xiaming Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/320,332

(22) PCT Filed: Mar. 7, 2016

(86) PCT No.: PCT/CN2016/075769
§ 371 (c)(1),
(2) Date: Dec. 20, 2016

(87) PCT Pub. No.: WO2016/161863
PCT Pub. Date: Oct. 13, 2016

(65) Prior Publication Data
US 2017/0256621 A1    Sep. 7, 2017

(30) Foreign Application Priority Data
Apr. 9, 2015 (CN) .......................... 2015 1 0166870

(51) Int. Cl.
*H01L 27/12* (2006.01)
*H01L 29/423* (2006.01)
(Continued)

(52) U.S. Cl.
CPC ...... *H01L 29/42384* (2013.01); *H01L 27/124* (2013.01); *H01L 27/1259* (2013.01);
(Continued)

(58) Field of Classification Search
None
See application file for complete search history.

(56) References Cited

U.S. PATENT DOCUMENTS 9,263,539 B2 *  2/2016  Yuan ................. H01L 29/42384
9,647,136 B2 *  5/2017  Lee ...................... H01L 29/7869
(Continued)

FOREIGN PATENT DOCUMENTS

CN    101090123    12/2007
CN    103227206    7/2013
(Continued)

OTHER PUBLICATIONS

Office Action from China Application No. 201510166870.0 dated Mar. 1, 2017.
(Continued)

*Primary Examiner* — Benjamin P Sandvik
(74) *Attorney, Agent, or Firm* — Calfee, Halter & Griswold LLP

(57) ABSTRACT

A thin film transistor, a method for fabricating the same, an array substrate, and a display device are provided. The thin film transistor comprises a copper gate, a gate insulating layer, an active layer, a source, and a drain. The thin film transistor further comprises a copper alloy layer which is arranged on a side of the gate facing the active layer.

7 Claims, 2 Drawing Sheets

(51) Int. Cl.
*H01L 29/786* (2006.01)
*H01L 29/49* (2006.01)
*H01L 29/45* (2006.01)

(52) U.S. Cl.
CPC ........ *H01L 29/458* (2013.01); *H01L 29/4908* (2013.01); *H01L 29/786* (2013.01)

(56) References Cited

U.S. PATENT DOCUMENTS

| | | | |
|---|---|---|---|
| 9,991,392 B2 * | 6/2018 | Koezuka | G02F 1/1368 |
| 2007/0002239 A1 | 1/2007 | Koike | |
| 2008/0079006 A1 * | 4/2008 | Park | C09K 13/08 257/72 |
| 2009/0184322 A1 * | 7/2009 | Takasawa | C23C 14/0036 257/66 |
| 2011/0169060 A1 * | 7/2011 | Lee | H01L 29/458 257/288 |
| 2013/0032793 A1 * | 2/2013 | Kim | H01L 29/7869 257/43 |
| 2013/0099240 A1 * | 4/2013 | Lee | H01L 29/7869 257/59 |
| 2014/0014950 A1 | 1/2014 | Hara et al. | |
| 2015/0069378 A1 * | 3/2015 | Cha | H01L 27/1225 257/43 |

FOREIGN PATENT DOCUMENTS

| | | |
|---|---|---|
| CN | 103299429 | 9/2013 |
| CN | 104701384 | 6/2015 |
| JP | 4243401 | 3/2009 |

OTHER PUBLICATIONS

International Search Report and Written Opinion from PCT/CN16/075769 dated Jun. 15, 2016.
Second Office Action from China Application No. 201510166870.0 dated Nov. 3, 2017.
Office action from Chinese Application No. 201510166870.0 dated May 4, 2018.

* cited by examiner

THIN FILM TRANSISTOR AND METHOD FOR FABRICATING THE SAME, ARRAY SUBSTRATE AND DISPLAY DEVICE

RELATED APPLICATIONS

The present application is the U.S. national phase entry of PCT/CN2016/075769, with an international filing date of Mar. 7, 2016, which claims the benefit of Chinese Patent Application No. 201510166870.0, filed on Apr. 9, 2015, the entire disclosures of which are incorporated herein by reference.

TECHNICAL FIELD

The present invention relates to the field of display, and in particular to a thin film transistor, a method for fabricating the same, an array substrate, and a display device.

BACKGROUND

In a process for fabricating an array substrate of a display device, aluminum (Al) is among the metal conductive materials which have been applied firstly. With continuous increase in resolution of the display device, aluminum gradually cannot meet new requirements. The application of aluminum has been hindered due to its drawbacks of high resistivity, prone to electronmigration failure, and hillocks during preparing process. In particular, with increase in resolution of the display device, both the wiring density and the wiring length per area increase, and aluminum is not suitable for fabricating the current display device.

To solve the above problem, copper (Cu) is applied as conductive material in the prior art. Cu has low resistivity (of 1.7 $\mu\Omega\cdot cm$, while Al has resistivity of 2.7 $\mu\Omega\cdot cm$), and has acceptable responding rate. Cu enables to form wirings or electrodes with reduced width to decrease loss. Cu can improve the wiring density, which facilitates realizing a display device with high resolution. However, as a conductive material, Cu has the following problems. Cu has strong diffusion ability, and wirings or electrodes made from Cu tend to be oxidized in an environment below 200° C., which may lead to display device defect or display abnormal. For example, in case a gate of the thin film transistor is made from Cu, Cu atoms may permeates in an active layer of the thin film transistor, which leads to function failure of the thin film transistor, and further leads to display device defect or display abnormal. For example, the gate of the thin film transistor made from Cu tends to be oxidized in an environment below 200° C. Once oxidized, the gate may lead to significant Mura defect in the display device, which leads to display device defect or display abnormal.

SUMMARY

In an embodiment of the present invention, it is provided a thin film transistor, which comprises a copper gate, a gate insulating layer, an active layer, a source, and a drain, and further comprises a copper alloy layer which is arranged on a side of the gate facing the active layer.

In the present embodiment, the copper alloy layer is arranged on the side of the gate facing the active layer in the thin film transistor. Alloying element accumulates at grain boundaries, crystallographic planes, and surfaces, and can prevent copper atoms from diffusing to the active layer, thus improving oxidation resistance of the gate. As a result, function failure of the thin film transistor is prevented, and problems of display device defect or display abnormal owing to Mura defect in the display device are avoided.

For example, the thin film transistor further comprises a copper alloy layer which is arranged on a side of the gate away from the active layer. In the present embodiment, oxidation resistance of the gate can be further improved.

For example, the thin film transistor further comprises a copper alloy layer which is arranged on a side of the source and the drain facing the active layer. In the present embodiment, the copper alloy layer is arranged on the side of the source and the drain facing the active layer. Alloying element accumulates at grain boundaries, crystallographic planes, and surfaces, and can prevent copper atoms from diffusing to the active layer, thus improving stability of the thin film transistor and oxidation resistance of the source and the drain.

For example, the thin film transistor further comprises an etching stop layer which is arranged between a layer in which the source and the drain are located and the active layer. In the present embodiment, the etching stop layer can protect the active layer during etching the source and the drain.

For example, the copper alloy layer is a copper-zirconium alloy layer or a copper-chromium alloy layer.

For example, the thin film transistor is a bottom-gate type or a top-gate type.

In an embodiment of the present invention, it is provided an array substrate, comprising the thin film transistor in the above embodiments.

For example, a layer in which the thin film transistor is located further comprises gate lines which have a same layer level as the gate, and a layer in which the source and the drain are located further comprises data lines which have a same layer level as the source and the drain.

In an embodiment of the present invention, it is provided a display device, comprising the array substrate in the above embodiments.

In an embodiment of the present invention, it is provided a method for fabricating a thin film transistor. The thin film transistor comprises a copper gate, a gate insulating layer, an active layer, a source, and a drain. The method comprises forming a copper alloy layer on a side of the gate facing the active layer.

For example, the thin film transistor is a bottom-gate type, and the copper alloy layer is formed on the side of the gate facing the active layer. The method comprises: depositing in sequence a copper metal film and a copper alloy film by physical vapor deposition, and forming the gate and the copper alloy layer from the copper metal film and the copper alloy film by a patterning process.

For example, the method further comprises annealing the thin film transistor in which the active layer and the copper alloy layer have been formed. During annealing, the temperature is about 200-400° C., and the duration is about 1-2 hours.

DETAILED DESCRIPTION OF EMBODIMENTS

The specific embodiments of the present invention shall be further described in the follow text with reference to the figures and the embodiments. The following embodiments are only used for explaining more clearly the technical solution of the present invention rather than limiting the protection scope of the present invention.

The present invention provides a thin film transistor. In the thin film transistor, a copper alloy layer is at least arranged on a side of a gate facing an active layer. Alloying element precipitates from the copper alloy layer accumulates at grain boundaries, crystallographic planes, and a surface of the copper alloy layer or its neighboring film, prevents copper atoms in the copper material of the gate from diffusing, and improve oxidation resistance of the copper material. As a result, function failure of the thin film transistor is prevented, and problems of display device defect or display abnormal owing to Mura defect in the display device are avoided.

The thin film transistor can be a bottom-gate type or a top-gate type. The copper alloy layer cannot only be arranged on a side of the gate facing the active layer of the thin film transistor, but also on either side of the gate (i.e., over the gate or below the gate). Further, the copper alloy layer can also be applied on either side or both sides of the source and drain of the thin film transistor. In case the thin film transistor is applied to an array substrate, a wiring in a same layer as the gate of the thin film transistor (e.g., gate lines, or common electrode lines) can have a structure which is the same as or similar with the gate, so as to increase oxidation resistance. Similarly, a wiring in a same layer as the source and drain of the thin film transistor (e.g., a data line) can have a structure which is the same as or similar with the gate.

The thin film transistor of the present invention will be described more clearly in an exemplary manner hereinafter.

Figure 1:
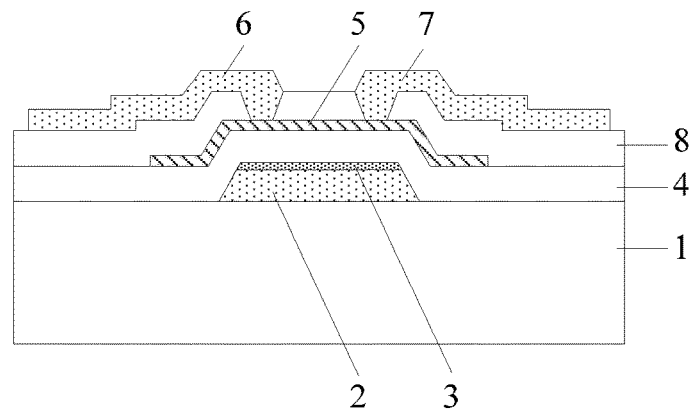
FIG. 1 is a structural view illustrating a first type thin film transistor in an embodiment of the present invention.

In an exemplary embodiment, as show in FIG. 1, the present invention provides a first type thin film transistor which comprises a substrate plate 1, a copper gate 2, a gate insulating layer 4, an active layer 5, a source 6, and a drain 7. The thin film transistor further comprises a copper alloy layer 3, which is arranged on a side of the gate 2 facing the active layer 5. In the present embodiment, the copper alloy layer 3 is arranged on the side of the gate 2 of the thin film transistor facing the active layer 5. Alloying element in the copper alloy layer 3 accumulates at grain boundaries, crystallographic planes, and surfaces, and can prevent copper atoms from diffusing to the active layer 5, thus improving oxidation resistance of the gate 2. As a result, function failure of the thin film transistor is prevented, and problems of display device defect or display abnormal owing to Mura defect in the display device are avoided.

For example, the copper alloy layer 3 is a copper-zirconium alloy layer or a copper-chromium alloy layer. During annealing in a process for fabricating the thin film transistor, zirconium atoms in the copper-zirconium alloy layer or chromium atoms in the copper-chromium alloy layer can precipitate from the copper matrix, and thus accumulate at an interface between the copper gate 2 and the copper alloy layer 3, to form a diffusion and oxidation resistant film.

For example, the thin film transistor further comprises an etching stop layer 8, which is arranged between a layer where the source 6, and the drain 7 are located and the active layer 5. In the present embodiment, the etching stop layer 8 can protect the active layer 5 during etching the source 6, and the drain 7.

In the present embodiment, the thin film transistor is a bottom-gate type. In the thin film transistor, the copper alloy layer 3 is arranged on the side of the gate 2 facing the active layer 5. Alloying element (e.g., zirconium, chromium) accumulates at grain boundaries, crystallographic planes, and surfaces, and can prevent copper atoms from diffusing to the active layer 5, thus improving oxidation resistance of the gate 2. As a result, function failure of the thin film transistor is prevented, and problems of display device defect or display abnormal owing to Mura defect in the display device are avoided.

Figure 2:
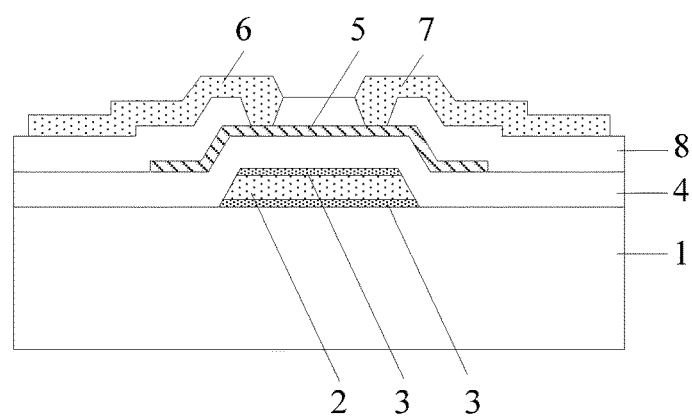
FIG. 2 is a structural view illustrating a second type thin film transistor in an embodiment of the present invention.

In another exemplary embodiment, as shown in FIG. 2, the present invention provides a second type thin film transistor, which comprises the substrate plate 1, the copper gate 2, the gate insulating layer 4, the active layer 5, the source 6, and the drain 7. The thin film transistor further comprises the copper alloy layer 3, which is arranged on the side of the gate 2 facing the active layer 5. This thin film transistor differs from that of FIG. 1 in that, the copper alloy layer 3 is further arranged on a side of the gate 2 away from the active layer 5. In the present embodiment, the copper alloy layer 3 is arranged on the upper side and lower side of the gate 2 of the thin film transistor. Alloying element in the copper alloy layer 3 accumulates at grain boundaries, crystallographic planes, and surfaces. For example, due to accumulation of alloying element from the copper alloy layer 3 which is arranged on the side of the gate 2 facing the active layer 5, copper atoms can be prevented from diffusing to the active layer 5, and oxidation resistance of the gate 2 can be improved. Due to accumulation of alloying element from the copper alloy layer 3 which is arranged on the side of the gate 2 away from the active layer 5, oxidation resistance of the gate 2 can further be improved. By means of the above structure, function failure of the thin film transistor is prevented, and problems of display device defect or display abnormal owing to Mura defect in the display device are avoided.

Similar to the thin film transistor shown in FIG. 1, the copper alloy layer 3 is a copper-zirconium alloy layer or a copper-chromium alloy layer. During annealing in a process for fabricating the thin film transistor, zirconium atoms in the copper-zirconium alloy layer or chromium atoms in the copper-chromium alloy layer can precipitate from the copper matrix, accumulate at an interface between the copper gate 2 and the copper alloy layer 3, to form a diffusion and oxidation resistant film.

For example, the thin film transistor further comprises the etching stop layer 8 which is arranged between a layer in which the source 6 and the drain 7 are located and the active layer 5. In the present embodiment, the etching stop layer 8 can protect the active layer 5 during etching the source 6 and the drain 7.

In the present embodiment, the thin film transistor is a bottom-gate type. In the thin film transistor, the copper alloy layer 3 is arranged on both upper and lower surface of the gate 2. Alloying element accumulates at grain boundaries, crystallographic planes, and surfaces, and can prevent copper atoms from diffusing to the active layer 5, thus improving oxidation resistance of the gate 2. As a result, function failure of the thin film transistor is prevented, and problems of display device defect or display abnormal owing to Mura defect in the display device are avoided.

Figure 3:
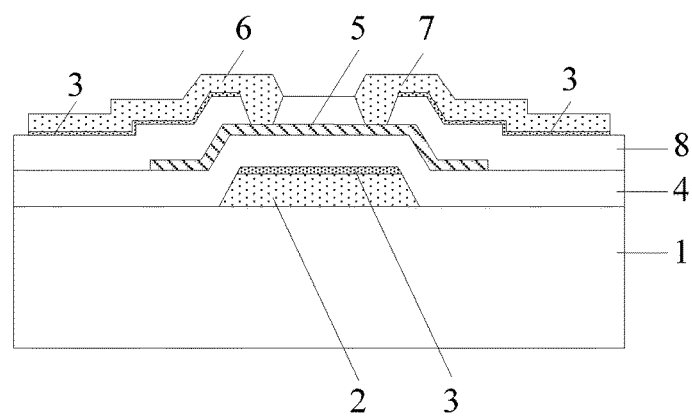
FIG. 3 is a structural view illustrating a third type thin film transistor in an embodiment of the present invention.

In another exemplary embodiment, as shown in FIG. 3, the present invention provides a third type thin film transistor, which comprise the substrate plate 1, the copper gate 2, the gate insulating layer 4, the active layer 5, the source 6, and the drain 7. The thin film transistor further comprises the copper alloy layer 3, which is arranged on the side of the gate 2 facing the active layer 5, and on a side of the source 6 and the drain 7 facing the active layer 5. In the thin film transistor of the present embodiment, the copper alloy layer 3 is arranged on the side of the gate 2 facing the active layer 5, and the side of the source and drain facing the active layer. Alloying element in the copper alloy layer 3 accumulates at grain boundaries, crystallographic planes, and surfaces, and can prevent copper atoms from diffusing to the active layer 5, thus improving oxidation resistance of the gate 2, the source 6, and the drain 7. As a result, function failure of the thin film transistor is prevented, and problems of display device defect or display abnormal owing to Mura defect in the display device are avoided.

Similar to the thin film transistor shown in FIG. 1, the copper alloy layer 3 is a copper-zirconium alloy layer or a copper-chromium alloy layer. During annealing in a process for fabricating the thin film transistor, zirconium atoms in the copper-zirconium alloy layer or chromium atoms in the copper-chromium alloy layer can precipitate from the copper matrix, and thus accumulate at an interface between the copper gate 2 and the copper alloy layer 3, to form a diffusion and oxidation resistant film.

For example, the thin film transistor further comprises the etching stop layer 8 which is arranged between the layer in which the source 6 and the drain 7 are located and the active layer 5. In the present embodiment, the etching stop layer 8 can protect the active layer 5 during etching the source 6 and the drain 7.

It is noted that, the copper alloy layer 3 can also be arranged on both upper side and lower side of the source 6 and the drain 7, i.e., arranged on the side of the source 6 and the drain 7 facing the active layer 5 and the side of the source 6 and the drain 7 away from the active layer 5. The structure is modified according to the thin film transistor of the present embodiment, which is not repeated for simplicity.

In the present embodiment, the thin film transistor is a bottom-gate type. In the thin film transistor, the copper alloy layer 3 is arranged on the side of the gate 2 facing the active layer 5, and the side of the source 6 and the drain 7 facing the active layer 5. Alloying element accumulates at grain boundaries, crystallographic planes, and surfaces, and can prevent copper atoms from diffusing to the active layer 5, thus improving oxidation resistance of the gate 2. As a result, function failure of the thin film transistor is prevented, and problems of display device defect or display abnormal owing to Mura defect in the display device are avoided.

The bonding strength between the gate 2 made from copper and the substrate plate 1 is not satisfactory. In order to improve the bonding strength, a transition layer is arranged on the substrate plate 1 prior to forming the gate. This will be described hereinafter with reference to the thin film transistor shown in FIG. 1.

Figure 4:
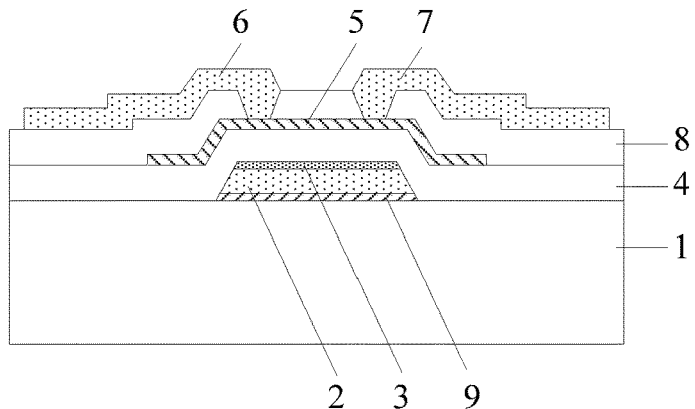
FIG. 4 is a structural view illustrating a fourth type thin film transistor in an embodiment of the present invention.

In a further exemplary embodiment, as shown in FIG. 4, the present invention provides a fourth type thin film transistor, which comprises the substrate plate 1, the transition layer 9, the copper gate 2, the gate insulating layer 4, the active layer 5, the source 6, and the drain 7. The thin film transistor further comprises the copper alloy layer 3 which is arranged on the side of the gate 2 facing the active layer 5. The transition layer 9 can be made from a molybdenum niobium alloy material, to improve the bonding strength between the copper gate 2 and the substrate plate 1. In the present embodiment, the copper alloy layer 3 is arranged on the side of the gate 2 facing the active layer 5 in the thin film transistor. Alloying element in the copper alloy layer 3 accumulates at grain boundaries, crystallographic planes, and surfaces, and can prevent copper atoms from diffusing to the active layer 5, thus improving oxidation resistance of the gate 2. As a result, function failure of the thin film transistor is prevented, and problems of display device defect or display abnormal owing to Mura defect in the display device are avoided.

For example, the copper alloy layer 3 is a copper-zirconium alloy layer or a copper-chromium alloy layer. During annealing in a process for fabricating the thin film transistor, zirconium atoms in the copper-zirconium alloy layer or chromium atoms in the copper-chromium alloy layer can precipitate from the copper matrix, and thus accumulate at an interface between the copper gate 2 and the copper alloy layer 3, to form a diffusion and oxidation resistant film.

For example, the thin film transistor further comprises the etching stop layer 8 arranged between the layer in which the source 6 and the drain 7 are located and the active layer 5. In the present embodiment, the etching stop layer 8 can protect the active layer 5 during etching the source 6 and the drain 7.

As compared with the embodiment shown in FIG. 1, in the embodiment shown in FIG. 4, the transition layer 9 is arranged between the gate 2 and the substrate plate 1. The present invention is not limited to this case. The transition layer can also be applied to embodiments shown in FIGS. 2-3. In the embodiment shown in FIG. 2, the transition layer for example can be arranged between the copper alloy layer 3 on a lower surface of the gate 2 and the substrate plate 1. In the embodiment shown in FIG. 3, the transition layer for example can be arranged between the gate 2 and the substrate plate 1.

The thin film transistor shown in FIG. 1-FIG. 4 is provided only for explaining the present invention, while the present invention is not limited thereto. For example, in the thin film transistor of a top-gate type, the copper alloy layer 3 can be arranged appropriately according to the arrangement of the gate 2, the source 6, and the drain 7, and the principle is identical with the bottom-gate type, which is not repeated for simplicity.

In an embodiment of the present invention, it is provided an array substrate, comprising the thin film transistor as described in the above embodiments.

For example, a layer in which the thin film transistor is located further comprises gate lines which have a same layer level as the gate, a layer in which the source and the drain are located further comprises data lines which have a same layer level as the source and the drain.

As for specific structure of the gate lines and data lines, reference can be made to the structure of the gate 2, the source 6, and the drain 7 shown in FIGS. 1-4.

Embodiments of the present invention have the following beneficial effects. A copper alloy layer is arranged on a side of the gate facing the active layer in the thin film transistor. Alloying element accumulates at grain boundaries, crystallographic planes, and surfaces, and can prevent copper atoms from diffusing to the active layer, thus improving oxidation resistance of the gate. As a result, function failure of the thin film transistor is prevented, and problems of display device defect or display abnormal owing to Mura defect in the display device are avoided.

In an embodiment of the present invention, it is provided a display device, which comprises the array substrate in the above embodiments. The display device can be a display panel, a mobile phone, a tablet computer, or the like.

Embodiments of the present invention have the following beneficial effects. A copper alloy layer is arranged on a side of the gate facing the active layer in the thin film transistor. Alloying element accumulates at grain boundaries, crystallographic planes, and surfaces, and can prevent copper atoms from diffusing to the active layer, thus improving oxidation resistance of the gate. As a result, function failure of the thin film transistor is prevented, and problems of display device defect or display abnormal owing to Mura defect in the display device are avoided.

In an embodiment of the present invention, it is provided a method for fabricating a thin film transistor. The thin film transistor comprises a copper gate, a gate insulating layer, an active layer, a source, and a drain. The method comprises forming a copper alloy layer on a side of the gate facing the active layer. In the present embodiment, by arranging the copper alloy layer on the side of the gate facing the active layer, alloying element precipitating from the copper alloy layer can accumulate at the grain boundaries, crystallographic planes, and surfaces, and can prevent copper atoms from diffusing to the active layer, thus improving oxidation resistance of the gate. As a result, function failure of the thin film transistor is prevented, and problems of display device defect or display abnormal owing to Mura defect in the display device are avoided.

Of course, the process for fabricating the thin film transistor requires modification on basis of the structure of the thin film transistor. The process for fabricating the thin film transistor shown in FIG. 4 is described hereinafter.

Figure 5:
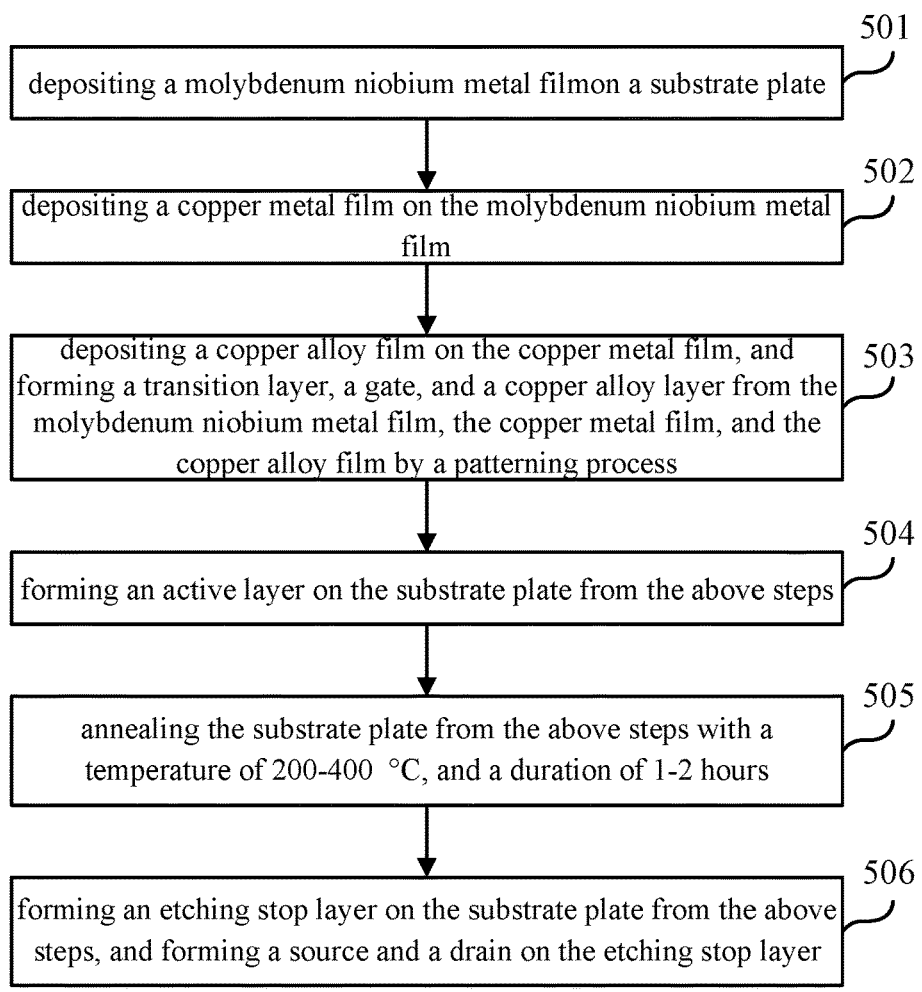
FIG. 5 is a flow chart illustrating a method for fabricating a thin film transistor in an embodiment of the present invention.

As shown in FIG. 5, an embodiment of the present invention provides a method for fabricating a thin film transistor, comprising the following steps.

Step 501, a molybdenum niobium metal film is deposited on a substrate plate.

Step 502, a copper metal film is deposited on the molybdenum niobium metal film.

Step 503, a copper alloy film is deposited on the copper metal film, and a transition layer, a gate, and a copper alloy layer are formed from the molybdenum niobium metal film, the copper metal film, and the copper alloy film by a patterning process.

Step 504, an active layer is formed on the substrate plate resulting from the above steps.

Step 505, the substrate plate resulting from the above steps is annealed. In the annealing process, the temperature is about 200-400° C., and the duration is about 1-2 hours. The annealing process enables alloying element in the copper alloy layer to precipitate from the copper matrix, so that the alloying element accumulates at grain boundaries, crystallographic planes, and surfaces.

Step 506, an etching stop layer is formed on the substrate plate resulting from the above steps, and a source and a drain are formed on the etching stop layer.

It is noted that, the copper alloy layer can be a copper-zirconium alloy layer or copper-chromium alloy layer. Physical vapor deposition is an example for the deposition in the above steps, which is not repeated for simplicity.

It is noted that, the copper gate as described above not only relates to a case in which the gate is made from pure copper, but also to a case in which the gate comprises other conductive material than copper.

Embodiments of the present invention have the following beneficial effects. A copper alloy layer is arranged on a side of the gate facing the active layer in the thin film transistor. Alloying element accumulates at grain boundaries, crystallographic planes, and surfaces, and can prevent copper atoms from diffusing to the active layer, thus improving oxidation resistance of the gate. As a result, function failure of the thin film transistor is prevented, and problems of display device defect or display abnormal owing to Mura defect in the display device are avoided.

Apparently, the person with ordinary skill in the art can make various modifications and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

What is claimed is:

1. A method for fabricating a thin film transistor, the thin film transistor is arranged on a substrate plate and comprises a copper gate, a gate insulating layer, an active layer, a source, and a drain, wherein the method comprises-forming a first copper alloy layer on a side of the gate facing the active layer, and annealing the thin film transistor in which the active layer and the first copper alloy layer have been formed, wherein the first copper alloy layer is a copper-chromium alloy layer, and chromium atoms in the first copper alloy layer precipitate during annealing to an interface between the copper gate and the first copper alloy layer, to form a chromium film for preventing copper atoms from diffusing and the copper gate from oxidation.

2. The method of claim 1, wherein the thin film transistor is a bottom-gate type, and the method comprises:
   depositing in sequence a copper metal film and a copper alloy film by physical vapor deposition, and forming the gate and the first copper alloy layer from the copper metal film and the copper alloy film by a patterning process.

3. The method of claim 1, wherein during annealing, the temperature is about 200-400° C., and the duration is about 1-2 hours.

4. The method of claim 1, further comprising: prior to forming the gate, forming a transition layer on the substrate plate.

5. The method of claim 4, wherein the transition layer is made from a molybdenum niobium alloy.

6. The method of claim 1, further comprising: forming a second copper alloy layer on a side of the gate away from the active layer.

7. The method of claim 6, wherein the second copper alloy layer is a copper-zirconium alloy layer or a copper-chromium alloy layer.

* * * * *